(12) United States Patent
Lin et al.

(10) Patent No.: US 10,333,466 B2
(45) Date of Patent: Jun. 25, 2019

(54) MULTI-ORDER WAVE VOLTAGE CONTROLLED OSCILLATOR

(71) Applicant: National Chi Nan University, Nantou County (TW)

(72) Inventors: Yo-Sheng Lin, Taichung (TW); Jin-You Liao, Nantou County (TW); Kai-Siang Lan, Kaohsiung (TW)

(73) Assignee: NATIONAL CHI NAN UNIVERSITY, Nantou County (TW)

( * ) Notice: Subject to any disclaimer, the term of this patent is extended or adjusted under 35 U.S.C. 154(b) by 91 days.

(21) Appl. No.: 15/654,184

(22) Filed: Jul. 19, 2017

(65) Prior Publication Data

US 2018/0294773 A1    Oct. 11, 2018

(30) Foreign Application Priority Data

Apr. 7, 2017   (TW) .............................. 106111680 A (51) Int. Cl.
| | | |
|---|---|---|
| *H03K 3/03* | (2006.01) | |
| *H03B 5/26* | (2006.01) | |
| *H03B 5/12* | (2006.01) | |
| *H03B 5/18* | (2006.01) | |
| *H03B 5/24* | (2006.01) | |

(52) U.S. Cl.
CPC ............. *H03B 5/26* (2013.01); *H03B 5/1215* (2013.01); *H03B 5/1221* (2013.01); *H03B 5/1228* (2013.01); *H03B 5/1243* (2013.01); *H03B 5/1852* (2013.01); *H03B 5/24* (2013.01)

(58) Field of Classification Search
CPC .......... H03B 5/26; H03B 5/1852; H03B 5/24; H03B 5/1243; H03B 5/1215; H03B 5/1228; H03B 5/1221

USPC ............ 331/57, 107 SL, 117 R, 117 FE, 167
See application file for complete search history.

(56) References Cited

U.S. PATENT DOCUMENTS

| | | | | |
|---|---|---|---|---|
| 2010/0091688 A1* | 4/2010 | Staszewski | .......... | H03D 7/1441 370/277 |
| 2016/0190985 A1* | 6/2016 | Lin | ...................... | H03B 5/1228 331/117 FE |
| 2017/0359024 A1* | 12/2017 | Lin | ...................... | H03B 5/1228 |

FOREIGN PATENT DOCUMENTS

TW    I296877 B    5/2008

\* cited by examiner

*Primary Examiner* — Richard Tan
(74) *Attorney, Agent, or Firm* — Muncy, Geissler, Olds & Lowe, P.C.

(57) ABSTRACT

A multi-order wave voltage controlled oscillator (VCO) includes a power impedance matching unit, a signal transmitting unit, a harmonic wave eliminating unit and an oscillation frequency adjusting unit. The power impedance matching unit includes an input end, an output end and a first transmission line between the input end and the output end. The first transmission line is a ¼-wavelength transmission line based on a wavelength of an output harmonic wave. The signal transmitting unit includes multiple upper inductor electrically connected to the output end and multiple lower inductors electrically connected to a ground end. The harmonic wave eliminating unit includes multiple transistors electrically connected to the signal transmitting unit and each having a drain electrically connected to a gate of the adjacent transistor to form a multi-order ring loop. The oscillation frequency adjusting unit includes multiple varactors.

5 Claims, 8 Drawing Sheets

MULTI-ORDER WAVE VOLTAGE CONTROLLED OSCILLATOR

FIELD OF THE INVENTION

The present invention relates to a multi-order wave voltage controlled oscillator (VCO), and particularly to a multi-order wave VCO operating at a high frequency band.

BACKGROUND OF THE INVENTION

In the field of wireless communication, transmitted signals and received signals are in general radio-frequency (RF) signals, and processed signals are all low-frequency signals. Thus, in the structure of an RF transceiver, a mixer is needed to convert low-frequency signals to RF signals that are then transmitted through an antenna. Further, a mixer is also needed to convert received RF signals to low-frequency signals, which are then processed by a backend digital circuit of the transceiver. A mixer circuit need a reference frequency in order to determine whether to convert RF signals in a predetermined frequency to low-frequency signals or to convert low-frequency signals in a predetermined frequency to RF signals. This reference frequency is provided by a voltage controlled oscillator (VCO) in the structure of the RF transceiver. Such VCO in the field of RF communication usually selects a form of transistor cross coupling pairs to provide energy needed for oscillations of a circuit.

In a semiconductor manufacturing process, production variations are constantly monitored due to delay effects caused by inductors and capacitors. A common solution is installing an additional ring oscillator in a manufacturing equipment. However, to reduce the cost of ring oscillators, multiple cascaded inverters are usually adopted.

For example, the Taiwan Patent No. 1296877 discloses a conventional oscillator. The oscillator of the above disclosure, operable in a variable driving voltage to generate an oscillation signal having a predetermined period, includes a plurality of logic elements connected to one another in a ring. Each logic elements includes a plurality of inverters. The oscillator further includes a voltage generating device that generates a first driving voltage and a second driving voltage, which are selectively applied to the logic element. Selectively applying the first driving voltage and the second voltage to the logic element causes an effect on the period of a signal that the oscillator generates. In a normal operation, when it is discovered that the period of a signal is equal to a predetermined period through a test, the first driving voltage is applied to the logic element; when it is discovered that the period of the signal of the oscillator differs from the predetermined period, the second driving voltage is applied to the logic element.

In the above prior art, the conventional ring oscillator disfavors the operation of baseband signals in a high frequency band. One reason is that, when the number of cascades in the ring oscillator increases, the phase margin (PM) generated is insufficient for maintaining oscillation conditions in the high frequency band. One solution for overcoming this issue is reducing to fundamental frequency. In other words, as the number of cascades increases, the lower oscillation frequency that the oscillation circuit generates becomes, hence limiting the operating frequency of the conventional ring oscillator.

SUMMARY OF THE INVENTION

It is an object of the present invention to solve the issue of a conventional ring oscillator being operable only in a low frequency band.

To achieve the above object, the present invention provides a multi-order wave voltage controlled oscillator (VCO) including a power impedance matching unit, a signal transmitting unit, a harmonic wave eliminating unit and an oscillation frequency adjusting unit. The power impedance matching unit includes an input end, a first transmission line and an output end. The input end is for inputting an external voltage. The first transmission line is disposed between the input end and the output end, and performs impedance matching on an input signal fed to the input end. Further, the first transmission line is a ¼-wavelength transmission line based on the wavelength of an output harmonic wave. The signal transmitting unit includes a plurality of upper inductors and a plurality of lower inductors disposed correspondingly to the upper inductors. The harmonic wave eliminating unit includes a plurality of transistors disposed between and electrically connected to the upper inductors and the lower inductors. Each of the transistors has its drain connected to a gate of the adjacent transistor to form a multi-order ring loop. The oscillation frequency adjusting unit includes a plurality of varactors. Each of the varactors has one end connected to a power output end of each of the transistors and one other end of each of the lower inductors, and one other end electrically connected to an tuning voltage.

Known from the above description, the present invention provides following features as opposed to the prior at. In the present invention, through the power impedance matching unit, the signal transmitting unit, the harmonic wave eliminating unit and the oscillation frequency adjusting unit provided, the multi-order wave VCO is operable at a high frequency band (W band).

DETAILED DESCRIPTION OF THE PREFERRED EMBODIMENTS

Details and technical contents of the present invention are given with the accompanying drawings below.

Figure 1A:
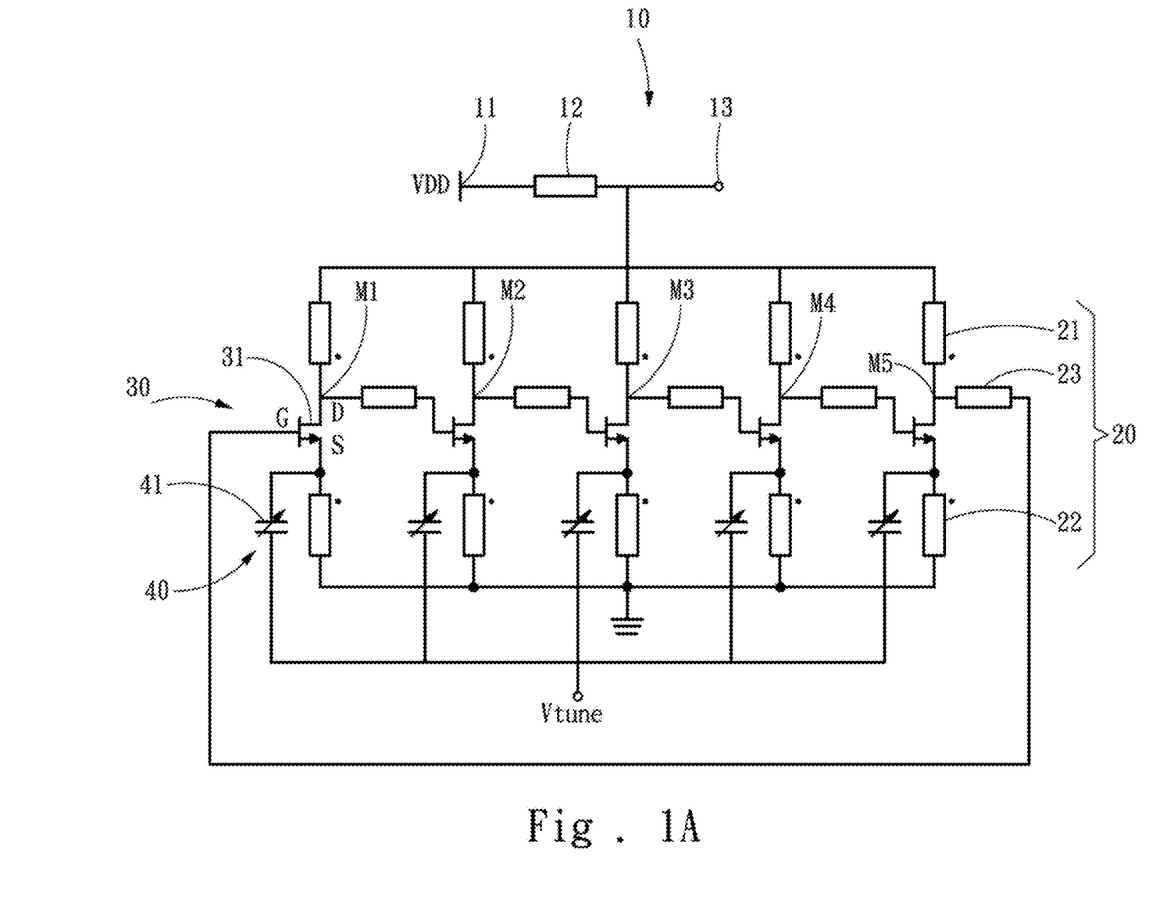
FIG. 1A is a circuit diagram of a multi-order wave voltage controlled oscillator (VCO) according to an embodiment of the present invention.

Referring to FIG. 1A showing a circuit diagram of a multi-order wave voltage controlled oscillator (VCO) according to an embodiment of the present invention. The present invention provides a multi-order wave VCO including a power impedance matching unit 10, a signal transmitting unit 20, a harmonic wave eliminating unit 30 and an oscillation frequency adjusting unit 40. The power impedance matching unit 10 includes an input end 11, a first transmission line 12 and an output end 13. The input end 11 is for inputting an external voltage. The first transmission line 12, disposed between the input end 11 and the output end 13, performs impedance matching on an output signal sent to the output end 13, and is a ¼-wavelength transmission line based on of a wavelength of an output harmonic wave. In this embodiment, the signal transmitting unit 20 includes a plurality of upper inductors 21, a plurality of lower inductors 22 disposed correspondingly to the upper inductors 21, and a plurality of intermediate inductors 23 each disposed between a previous-order drain and a next-order gate. In the present invention, the upper inductors 21, the lower inductors 22 and the intermediate inductors 23 may be independently formed as a transmission line inductor or a spiral inductor. One end of each of the upper inductors 21 is electrically connected to the output end 13, and one end of each of the lower inductors 22 is electrically connected to a ground end. The size of an output baseband frequency of the multi-order wave VCO may be adjusted by modifying the lengths of the upper inductors 21 and the lower inductors 22. In this embodiment, each upper inductor 21 and the corresponding lower inductor 22 are respectively a main coil and a secondary coil of a same transformer, as shown by the dots in FIG. 1A. As such, the upper inductor 21 and the corresponding lower inductor 22 may adopt shorter lengths due to positive coupling between the two.

The harmonic wave eliminating unit 30 includes a plurality of transistors 31, which are disposed between and electrically connected to the upper inductor 21 and the lower inductor 22. Each of the transistors 31 has a drain D electrically connected to a gate G of the adjacent transistor 31 to form a multi-order ring loop. In this embodiment, the transistors 31 may be bipolar junction transistors (BJTs), field effect transistors (FETs), junction field effect transistors (JFETs), metal oxide semiconductor field effect transistors (MOSFETs), or a combination of the above.

The oscillation frequency adjusting unit 40 includes a plurality of varactors 41. Each of the varactors 41 has one end electrically connected to a power output end S of the corresponding transistor 31 and the other end of the corresponding lower inductor 22, and the other end electrically connected to an tuning voltage $V_{tune}$. The capacitance value of each varactor 41 is adjusted by the tuning voltage $V_{tune}$. For example, when the voltage of the tuning voltage $V_{tune}$ is increased, the capacitance value rises or drops, and whether the capacitance value rises or drops is determined by a configuration direction of positive and negative ends of the varactor 41. In this embodiment, the varactors 41 are metal-insulator-metal capacitors.

Figure 1B:
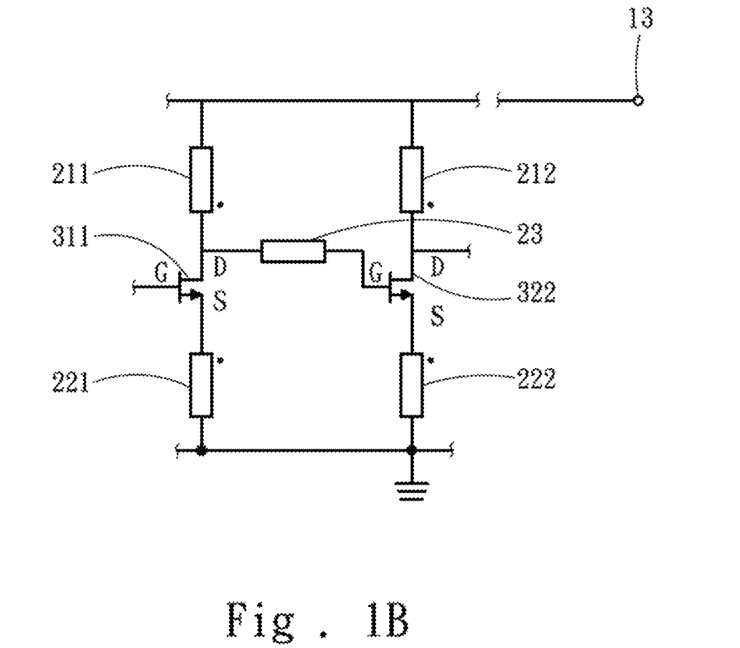
FIG. 1B is a partial circuit diagram of FIG. 1A.

In one embodiment of the present invention, taking a five-order ring oscillator for example, the number of each the upper inductors 21, the lower inductors 22 and the transistors 31 is five. Refer to FIG. 1B as well as FIG 1A for further details on the circuit structure of the five-order ring oscillator. FIG. 1B shows a partial circuit diagram of FIG. 1A. Each upper inductor 21 includes a first upper inductor 211 and a second upper inductor 212. Each lower inductor 22 includes a first lower inductor 221 and a second lower inductor 222. Each transistor 31 includes a first transistor 311 and a second transistor 322. Each of the first upper inductor 211 and the second upper inductor 212 has an upper end electrically connected to the output end 13, and a lower end electrically connected to drains D of the first transistor 311 and the second transistor 322. The first transistor 311 and the second transistor 322 have their power output ends S electrically connected to upper ends of the first lower inductor 221 and the second lower inductor 222, respectively. The first lower inductor 221 and the second lower inductor 222 have their lower ends electrically connected to the ground end. The first upper inductor 211 has its lower end electrically connected to the drain D of the first transistor 311 and the gate G of the second transistor 322. The second upper transmission inductor 212 has its lower end electrically connected to the drain D of the second transistor 322 and a gate G of a third transistor (not shown) adjacent to the second transistor 322 and away from the first transistor 311. Accordingly, the five-order ring oscillator in FIG. 1A is formed. In another embodiment, the ring oscillator may be in three orders, and the number of each of the upper inductors 21, the lower inductors 22 and the transistors 31 may be three. In yet another embodiment, the ring oscillator may be in seven orders, and the number of each of the upper inductors 21, the lower inductors 22 and the transistors 31 is seven. The present invention is not limited to the above exemplary values, and numbers of the upper inductors 21, the lower inductor 22 and the transistors 31 may be corresponding and be N, where N is an integer that is greater than or equal to three and is an odd number, e.g., 3, 5, 7, and 9. That is, the number of orders of the ring oscillator may be adjusted according to actual requirements.

Figure 2:
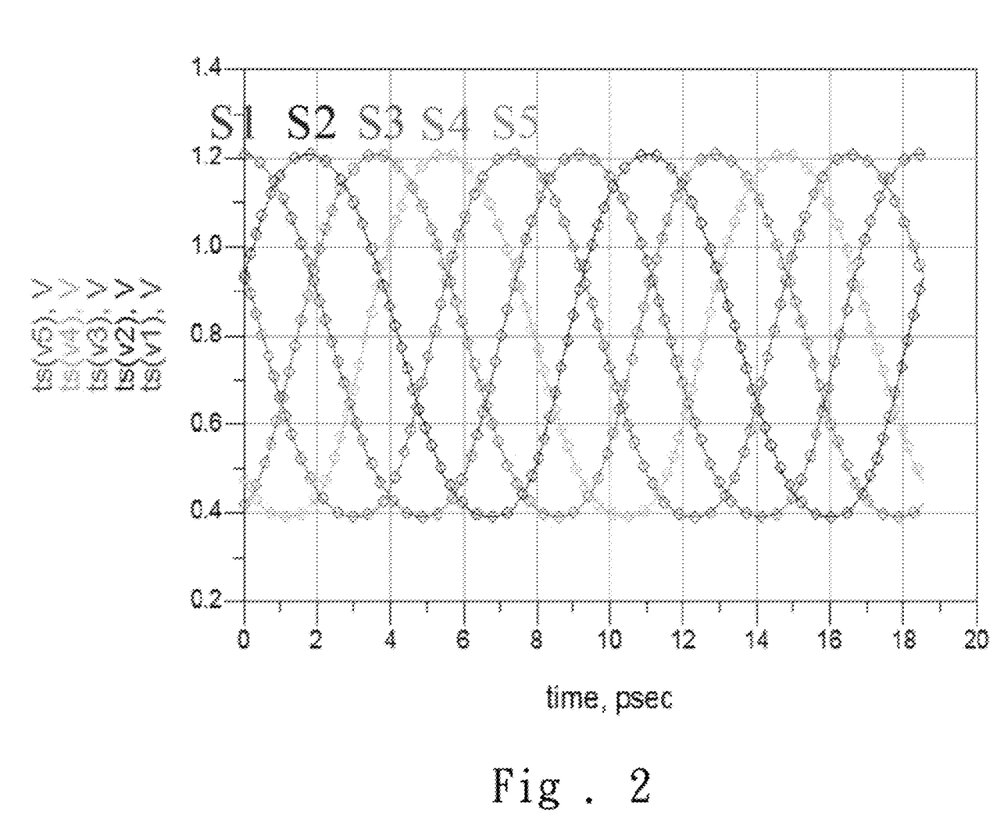
FIG. 2 is a waveform of a multi-order oscillation period according to an embodiment of the present invention.

Referring to FIG. 2 showing a waveform of a multi-order oscillation period according to an embodiment of the present invention, this waveform is obtained from measuring positions of the drains D of the transistors 31 in the five-order ring oscillator. The leftmost drain D in FIG. 1A is defined as a first measuring point M1, and the measured waveform is defined as a first signal waveform S1. Sequentially to the right, a second measuring point M2, a third measuring point M3, a fourth measuring point M4 and a fifth measuring point M5 are defined. According to a second signal waveform S2, a third signal waveform S3, a fourth signal waveform S4 and a fifth signal waveform S5 measured at the above measuring points, it is seen from the diagram that, the amplitudes and the frequencies of these signals are equal, and these signals differ by only having different phases. When a current signal forms a loop, the phase is exactly 360°, and so the signal waveforms may be superimposed on the same signal waveform to output an oscillation waveform having a predetermined frequency. In this embodiment, the predetermined frequency is 100 GHz.

Figure 3A:
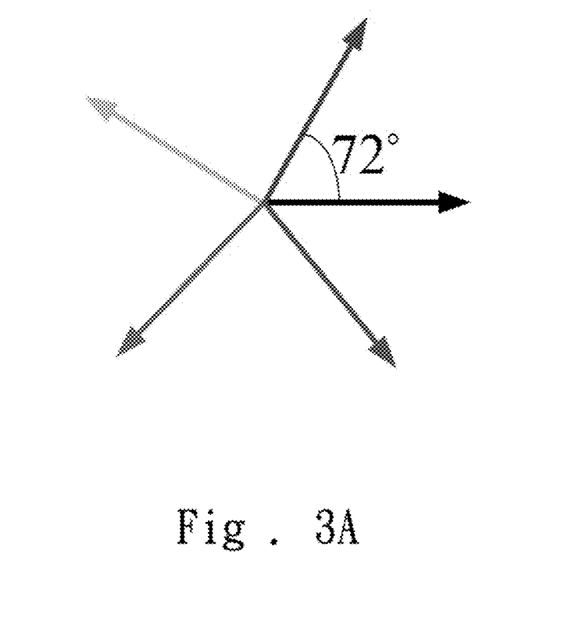
FIG. 3A-E are phase diagrams of respective signals in a five-order ring oscillator according to an embodiment of the present invention.
Figure 3B:
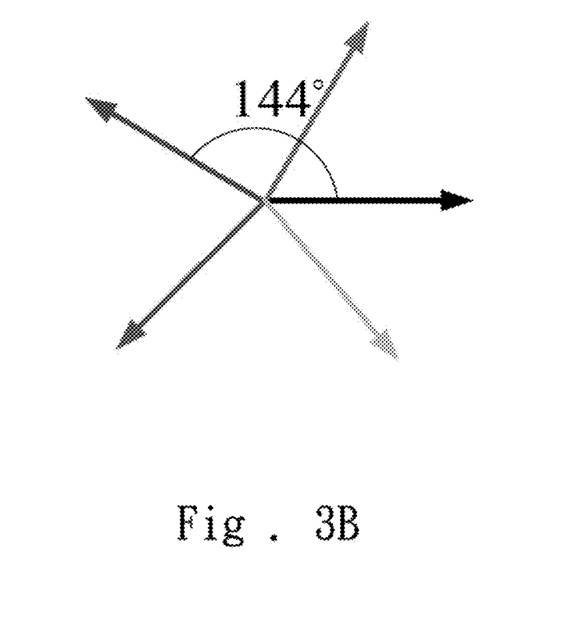
Figure 3C:
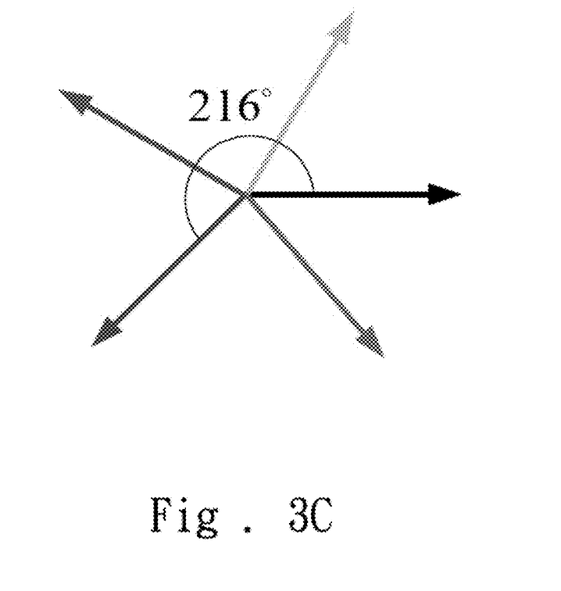
Figure 3D:
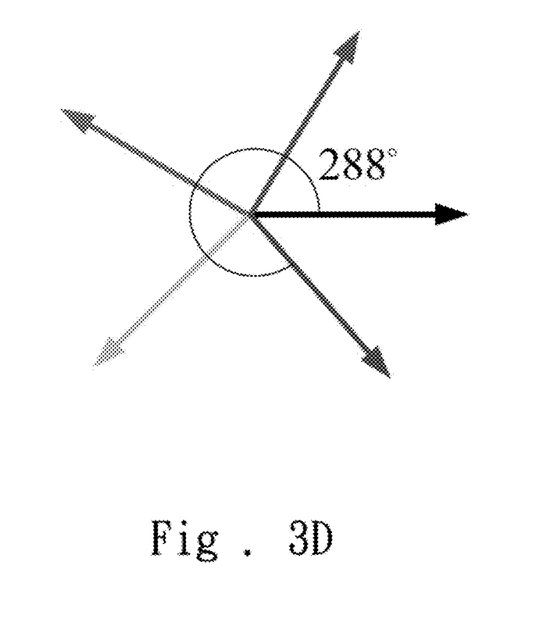
Figure 3E:
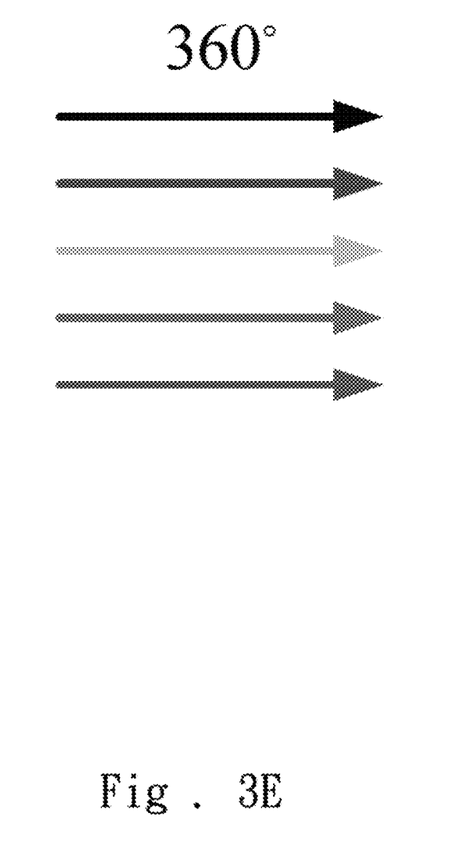

FIG. 3A-E are phase diagrams of the signals in the different orders of the five-order ring oscillator according to an embodiment of the present invention. When a phase of a fundamental frequency of a signal at the first measuring point M1 is set to 0°, the phase difference between the signals at each of the measuring points and a previous measuring point is 72°, as shown in FIG. 3A. When the phase of a second-order harmonic wave of a signal at the first measuring point M1 is set to 0°, the phase difference between the signals at each of the measuring points and a previous measuring point is 144°, as shown in FIG. 3B. When the phase of a third-order harmonic wave of a signal at the first measuring point M1 is set to 0°, the phase difference between the signals at each of the measuring points and a previous measuring point is 216°, as shown in FIG. 3C. When the phase of a fourth-order harmonic wave of a signal at the first measuring point M1 is set to 0°, the phase difference between the signals at each of the measuring points and a previous measuring point is 288°, as shown in FIG. 3D. When the phase of a fifth-order harmonic wave of a signal at the first measuring point M1 is set to 0°, the phase difference between the signals at each of the measuring points and a previous measuring point is 360°, as shown in FIG. 3E. It should be noted that, when the phase difference of the signal is 360°, the phase difference of the signal is equivalently 0°. In other words, an additive interference is generated at the drains D of the transistors 31, and a destructive interference is generated at the parts of the fundamental frequency, the second-order harmonic wave, the third-order harmonic wave and the fourth-order harmonic wave.

Figure 4:
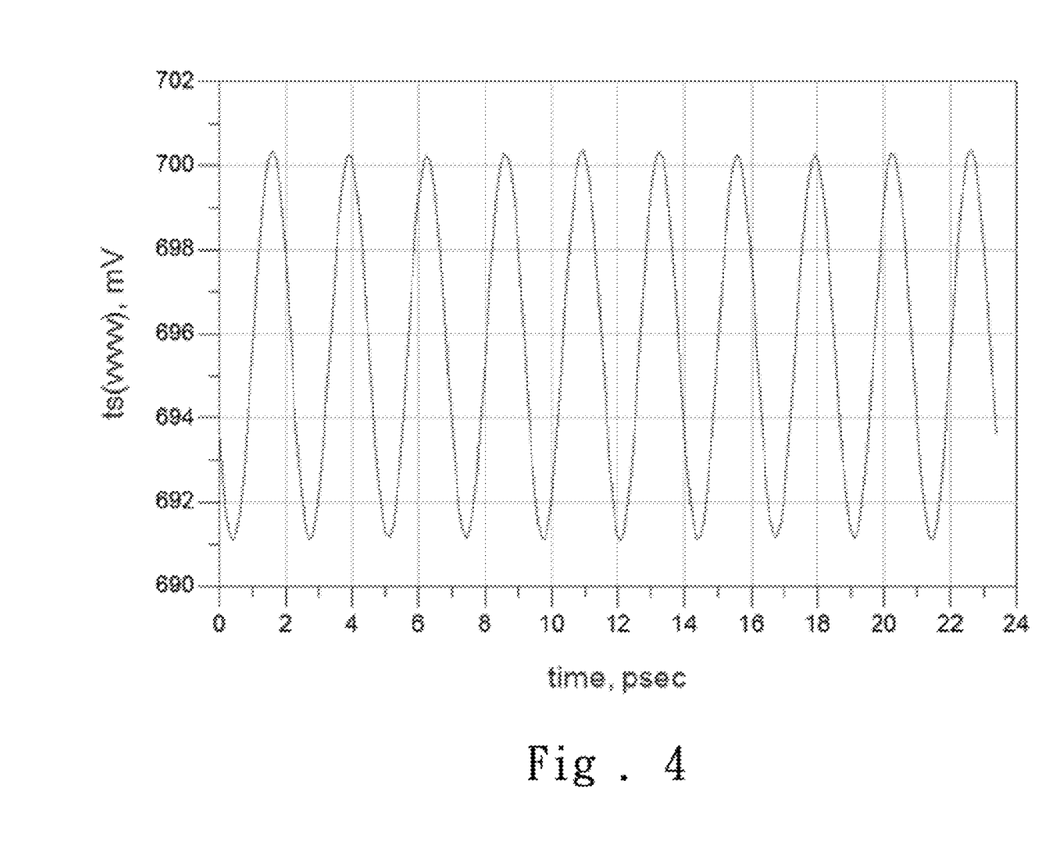
FIG. 4 is a waveform of an oscillation period of a five-order harmonic wave according to an embodiment of the present invention.

Referring to FIG. 4 as well as FIG. 1, FIG. 4 shows a waveform of an oscillation period of a fifth-order harmonic wave according to an embodiment of the present invention. This waveform is obtained by measuring the output end 13. As previously stated, the additive interference is generated at the drain D when the transistor 31 is in a situation of a fifth-order harmonic wave, and so a continuous oscillation waveform having a frequency of 500 GHz is generated at the output end 13. In this embodiment, the continuous oscillation wave is generated through the first transmission line 12 provided, and the first transmission line 12 is a ¼-wavelength transmission line. One reason for the above is that, the output signal having been processed by the signal transmitting unit 20, the harmonic wave eliminating unit 30 and the oscillation frequency adjusting unit 40 is a small high-frequency signal, which may consider the input end 11 as a short-circuit point and be inputted to the input end 11 if the first transmission line 12 is not provided. With the first transmission line 12 provided, impedance matching is performed on the small high-frequency signal, such that the small high-frequency signal considers the input end 11 is an open-circuit point and is inputted to the output end 13.

Figure 5:
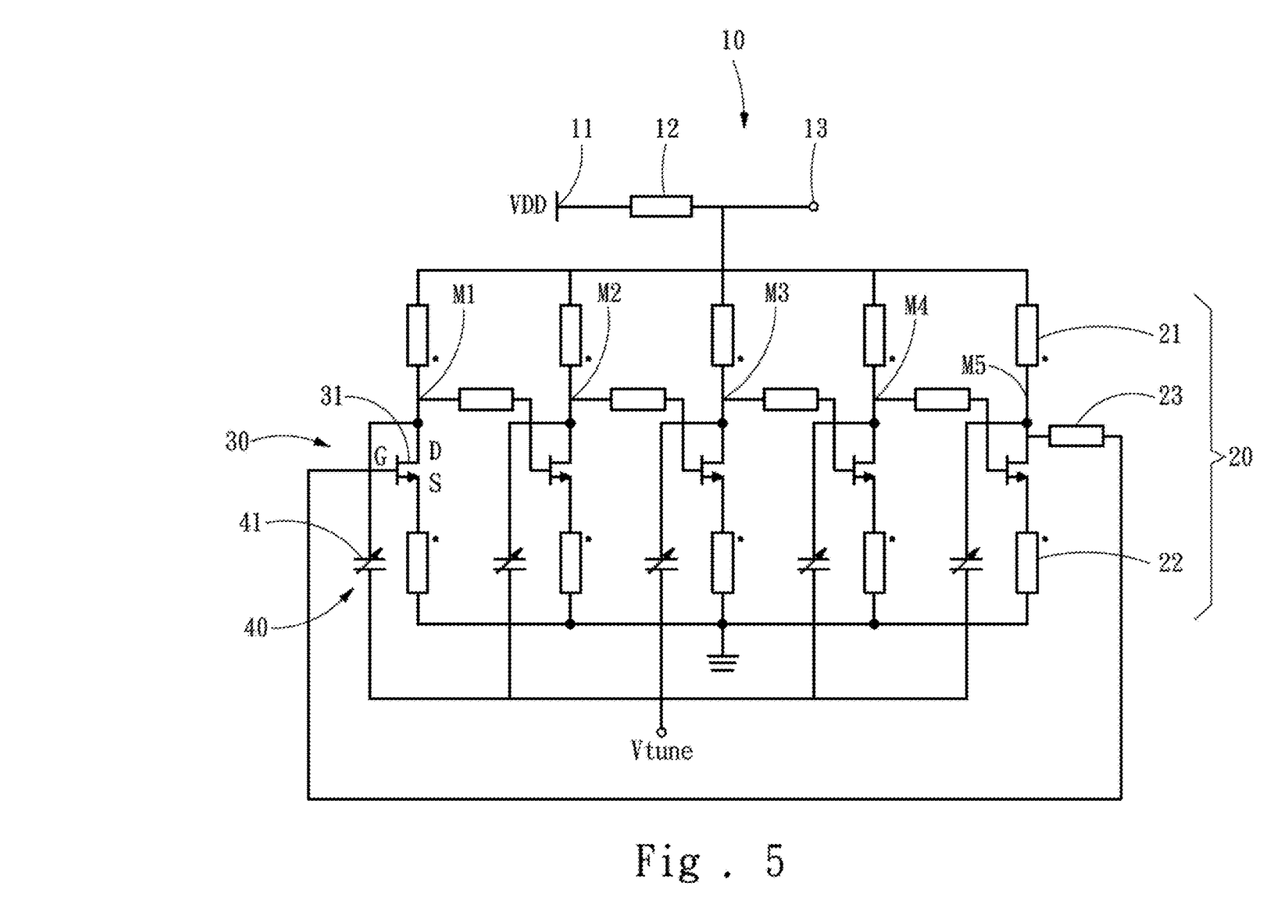
FIG. 5 is a circuit diagram of a multi-order wave VCO according to another embodiment of the present invention.

FIG. 5 shows a circuit diagram of a multi-order wave VCO according to another embodiment of the present invention. One difference of this embodiment from that in FIG. 1A is that, in this embodiment, each varactor 41 has one end electrically connected to the drain D of the corresponding transistor 31.

In conclusion, with the power impedance matching unit, the signal transmitting unit, the harmonic wave eliminating unit and the oscillation frequency adjusting unit provided, the present invention provides the multi-order wave VCO with an advantage of being operable in a high frequency band (W band).

What is claimed is:

1. A multi-order wave voltage controlled oscillator (VCO), comprising:
   a power impedance matching unit, comprising an input end, a first transmission line and an output end, the input end for inputting an external voltage, the first transmission line disposed between the input end and the output end and performing impedance matching on an output signal sent to the output end, wherein the first transmission line is a ¼-wavelength transmission line based on a wavelength of an output harmonic wave;
   a signal transmitting unit, comprising a plurality of upper inductors and a plurality of lower inductors disposed correspondingly to the upper inductors, each of the upper inductors having one end electrically connected to the output end, each of the lower inductors having one end electrically connected to a ground end;
   a harmonic wave eliminating unit, comprising a plurality of transistors disposed between and electrically connected to the upper inductors and the lower inductors, each of the transistors having a drain electrically connected to a gate of the adjacent transistor to form a multi-order ring loop, wherein the numbers of the upper inductors, the lower inductors and the transistors are corresponding and are N, where N is an integer that is greater than or equal to 3 and is an odd number; and
   an oscillation frequency adjusting unit, comprising a plurality of varactors, each of the varactors having one end electrically connected to a power output end of the corresponding transistor and one other end of the corresponding lower inductor, and one other end electrically connected to an tuning voltage.

2. The multi-order wave VCO of claim 1, wherein each of the transistors is at least one selected from a group consisting of a bipolar junction transistor (BJT), a field effect transistor (FET), a junction field effect transistor (JFET) and a metal oxide semiconductor field effect transistor (MOSFET).

3. The multi-order wave VCO of claim 1, wherein each of the varactors is a metal-insulator-metal capacitor.

4. The multi-order wave VCO of claim 1, wherein the signal transmitting unit further comprises a plurality of intermediate inductors each disposed between a previous-order drain and a next-order gate.

5. The multi-order wave VCO of claim 1, wherein positive coupling is formed between each of the upper inductors and the corresponding lower inductors.

* * * * *